(12) United States Patent
Kim

(10) Patent No.: US 7,989,863 B2
(45) Date of Patent: Aug. 2, 2011

(54) METHOD OF FORMING A SEMICONDUCTOR DEVICE HAVING AN ETCH STOP LAYER AND RELATED DEVICE

(75) Inventor: Si-Youn Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 203 days.

(21) Appl. No.: 12/498,302

(22) Filed: Jul. 6, 2009

(65) Prior Publication Data

US 2009/0267231 A1      Oct. 29, 2009

Related U.S. Application Data

(62) Division of application No. 11/424,518, filed on Jun. 15, 2006, now Pat. No. 7,572,721.

(30) Foreign Application Priority Data

Dec. 29, 2005   (KR) .............................. 2005-0133933

(51) Int. Cl.
*H01L 27/108* (2006.01)
*H01L 29/94* (2006.01)
(52) U.S. Cl. .............................. 257/296; 257/E27.084
(58) Field of Classification Search .................. 257/296, 257/E27.084
See application file for complete search history.

(56) References Cited

U.S. PATENT DOCUMENTS

| 6,211,091 B1 | 4/2001 | Lien et al. |
| 6,649,508 B1 | 11/2003 | Park et al. |
| 2005/0037590 A1 | 2/2005 | Inoue et al. |

FOREIGN PATENT DOCUMENTS

| JP | 2003-249572 | 9/2003 |
| KR | 2001-0077518 | 8/2001 |
| KR | 10-2005-0002985 | 1/2005 |

*Primary Examiner* — David A Zarneke
(74) *Attorney, Agent, or Firm* — Volentine & Whitt, PLLC

(57) ABSTRACT

In one embodiment, a lower interlayer dielectric layer, and first and second landing pads penetrating the lower interlayer dielectric layer are formed on a substrate. Interconnection patterns covering the second landing pads are formed on the lower interlayer dielectric layer. An etch stop layer is formed over the interconnection patterns. An upper interlayer dielectric layer filling a gap region between the interconnection patterns is formed on the etch stop layer. The upper interlayer dielectric layer is patterned to form a preliminary contact hole between the interconnection patterns, where the etch stop layer is exposed at the bottom of the preliminary contact hole. The preliminary contact hole is extended and the etch stop layer exposed by the extended preliminary contact hole is removed to form a first contact hole exposing the first landing pad. A buried contact plug is then formed within the first contact hole.

8 Claims, 11 Drawing Sheets

METHOD OF FORMING A SEMICONDUCTOR DEVICE HAVING AN ETCH STOP LAYER AND RELATED DEVICE

CROSS-REFERENCE TO RELATED PATENT APPLICATION

This application is a Divisional of U.S. Ser. No. 11/424,518, filed on Jun. 15, 2006, now is pending, which claims priority from Korean Patent Application No. 2005-0133933, filed Dec. 29, 2005, all of which are hereby incorporated by reference in their entirety.

BACKGROUND

1. Field of the Invention

The present invention relates to a semiconductor device and a method of fabricating the same, and more particularly, to a method of fabricating a semiconductor device having an etch stop layer between a bit line pattern and a buried contact plug, and a related device.

2. Description of the Related Art

As memory devices, such as Dynamic Random Access Memory (DRAM), becomes more highly integrated and have very high speeds, a reduction in contact resistance is necessarily required. DRAM devices have a landing pad, a bit line, a bit contact plug, a buried contact plug, and a storage node. A metal material such as tungsten is widely used as the bit line. Further, the bit line is connected to a lower conductive pattern such as the landing pad via the bit contact plug. Polysilicon is widely employed as the layer-forming material of the landing pad. Technology regarding the forming of metal silicide between the bit contact plug and the landing pad has been researched in order to reduce the contact resistance.

FIGS. 1 to 3 are cross-sectional views illustrating a method of fabricating a conventional semiconductor device having a bit line and a buried contact plug.

Referring to FIG. 1, an isolation layer 13 is formed within a semiconductor substrate 11 to define an active region 12. A lower interlayer dielectric layer 15 is formed on the surface of the semiconductor substrate 11 having the isolation layer 13. First and second landing pads 16 and 17 are formed through the lower interlayer dielectric layer 15 to contact the active region 12. The landing pads 16 and 17 are formed of a polysilicon layer. Top surfaces of the landing pads 16 and 17 and a top surface of the lower interlayer dielectric layer 15 are formed to be at approximately the same level.

An intermediate interlayer dielectric layer 25 is formed on the surface of the semiconductor substrate 11 having the landing pads 16 and 17. A bit contact hole is formed through the intermediate interlayer dielectric layer 25 to expose the second landing pad 17. A bit plug spacer 21 is formed on the sidewalls of the bit contact hole. A silicidation process is then carried out to form a metal silicide layer 18 in the second landing pad 17 exposed at the bottom of the bit contact hole. In this case, the top surface of the metal silicide layer 18 is disposed on substantially the same level as the top surface of the first landing pad 16 and the top surface of the lower interlayer dielectric layer 15.

Subsequently, a metal layer is formed, which fills the bit contact hole and covers the intermediate interlayer dielectric layer 25. The metal layer is formed of a tungsten layer. A hard mask pattern 31 is formed on the metal layer. The metal layer is patterned to form a bit line 29. As a result, a bit contact plug 23 is formed within the bit contact hole. The bit line 29 is electrically connected to the metal silicide layer 18 and the second landing pad 17 via the bit contact plug 23. A bit line spacer 27 is formed on the sidewalls of the bit line 29 and the hard mask pattern 31. An upper interlayer dielectric layer 35 is formed on the surface of the semiconductor substrate 11 having the bit line 29.

Referring to FIG. 2, the upper interlayer dielectric layer 35 and the intermediate interlayer dielectric layer 25 are patterned to form a buried contact hole 37 exposing the first landing pad 16. An isotropic etching process is then carried out to extend the buried contact hole 37.

While the buried contact hole 37 is extended, the lower interlayer dielectric layer 15 is partially etched to form a recess. In addition, the metal silicide layer 18 is partially exposed. The metal silicide layer 18 generally has a high etch rate with respect to the isotropic etching process. Thus, the metal silicide layer 18 is also partially etched by the isotropic etching process so that an air gap 18H is formed. Consequently, the contact area between the bit contact plug 23 and the metal silicide layer 18 may be significantly reduced due to the air gap 18H.

Referring to FIG. 3, an insulating spacer 39 is formed on the sidewalls of the extended buried contact hole 37. The insulating spacer 39 is formed of an insulating layer such as a silicon nitride layer. While the insulating spacer 39 is formed, the insulating layer also penetrates into the air gap 18H to form a contact barrier layer 18S.

A buried contact plug 41 is then formed, which fills the extended buried contact hole 37. A storage node 43 is formed on the buried contact plug 41.

According to the conventional method of fabricating a semiconductor device as described above, the contact resistance between the bit contact plug 23 and the metal silicide layer 18 may substantially increase due to the reduced contact surface area and the presence of the contact barrier layer 18S. Accordingly, it may be difficult to control the contact resistance between the bit contact plug 23 and the metal silicide layer 18 in a conventional method of forming the contact plug.

Meanwhile, other methods of forming the contact plug are disclosed in U.S. Patent Application Publication No. 2005/0037590 A1 entitled "Semiconductor Device and Method for Manufacturing Same" to Inoue, et al.

According to Inoue, et al., a first interlayer dielectric layer is formed on a semiconductor substrate. A plurality of bit lines are formed on the first interlayer dielectric layer. A second interlayer dielectric layer is disposed between the bit line and the first interlayer dielectric layer. A nitride layer is formed, which covers sidewalls and a top surface of the bit line and covers sidewalls of the second interlayer dielectric layer. A third interlayer dielectric layer is formed on the semiconductor substrate having the nitride layer. A capacitor contact plug is disposed between the bit lines, which sequentially penetrates the third interlayer dielectric layer and the nitride layer. Accordingly, the capacitor contact plug is insulated from the bit lines by the nitride layer.

However, a technique of forming the buried contact plug between the bit lines so as to generate a contact surface as large as possible between the contact plug and the landing pad while preventing the landing pad below the bit line from being damaged is still required.

SUMMARY

Embodiments of the present invention provide a method of fabricating a semiconductor device capable of preventing a conductive pattern below bit lines from being damaged while forming a contact plug between the bit lines, and the semiconductor device having the contact plug disposed between the bit line patterns. In one embodiment, a method of fabricating a semiconductor device having an etch stop layer between an interconnection pattern and a buried contact plug includes forming a lower interlayer dielectric layer on a semiconductor substrate, and forming first and second landing pads spaced apart from each other within the lower interlayer dielectric layer, so as to penetrate the lower interlayer dielectric layer and be in contact with the semiconductor substrate. Further, interconnection patterns covering the second landing pads are formed on the lower interlayer dielectric layer. An etch stop layer is formed to cover a surface of the substrate having the interconnection patterns. An upper interlayer dielectric layer is formed on the etch stop layer to fill a gap region between the interconnection patterns, and the upper interlayer dielectric layer is patterned to form a preliminary contact hole between the interconnection patterns. The etch stop layer is then exposed at the bottom of the preliminary contact hole, and the preliminary contact hole may be extended. The etch stop layer exposed by the preliminary contact hole is then removed to form a first contact hole exposing the first landing pad.

BRIEF DESCRIPTION OF THE DRAWINGS

The foregoing and other objects, features and advantages of the invention will be apparent from the detailed description of embodiments of the present invention, as illustrated in the accompanying drawing.

DETAILED DESCRIPTION

Figure 1:
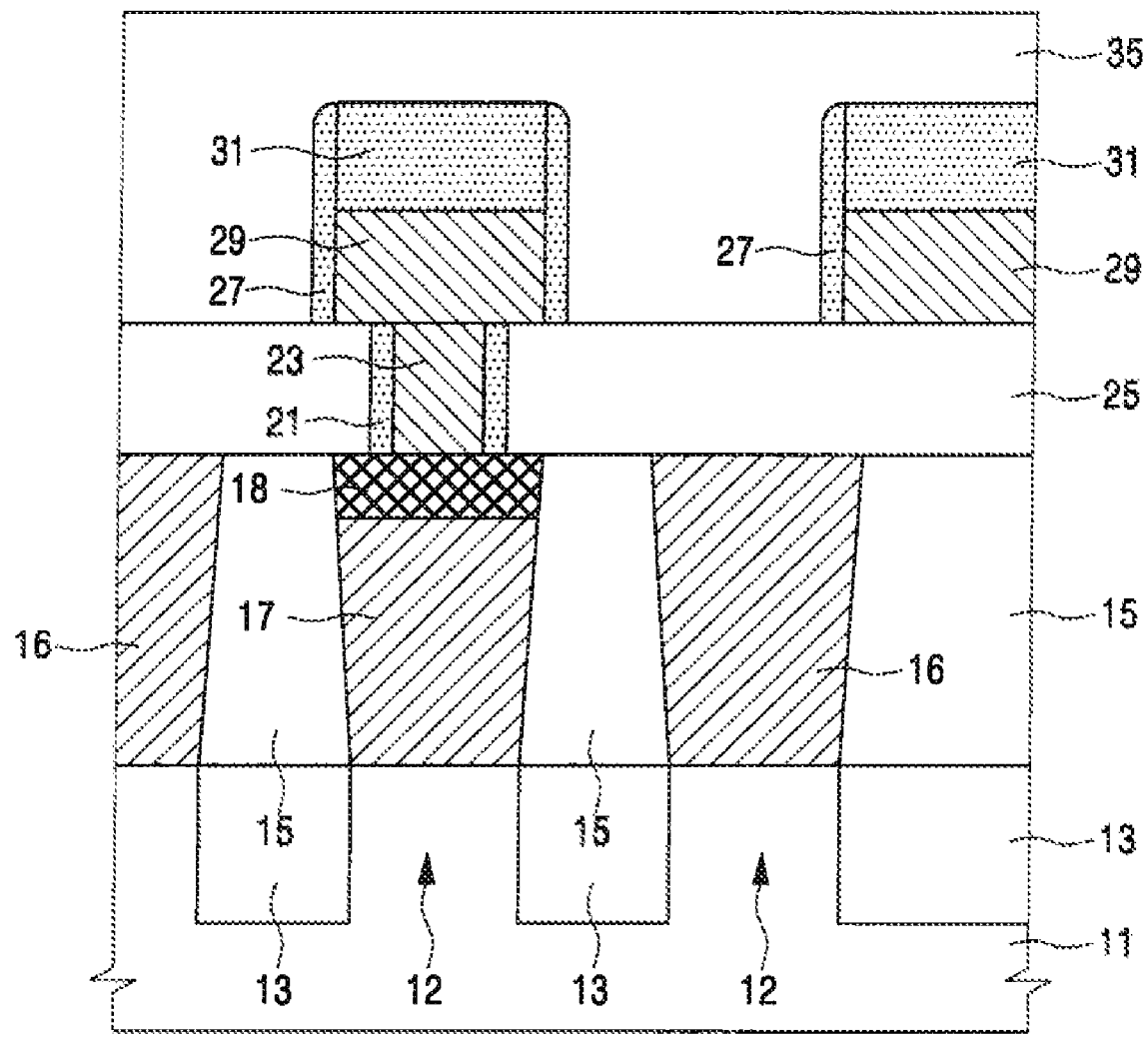
FIGS. 1 to 3 are cross-sectional views illustrating a method of fabricating a conventional semiconductor device having a bit line and a buried contact plug.
Figure 2:
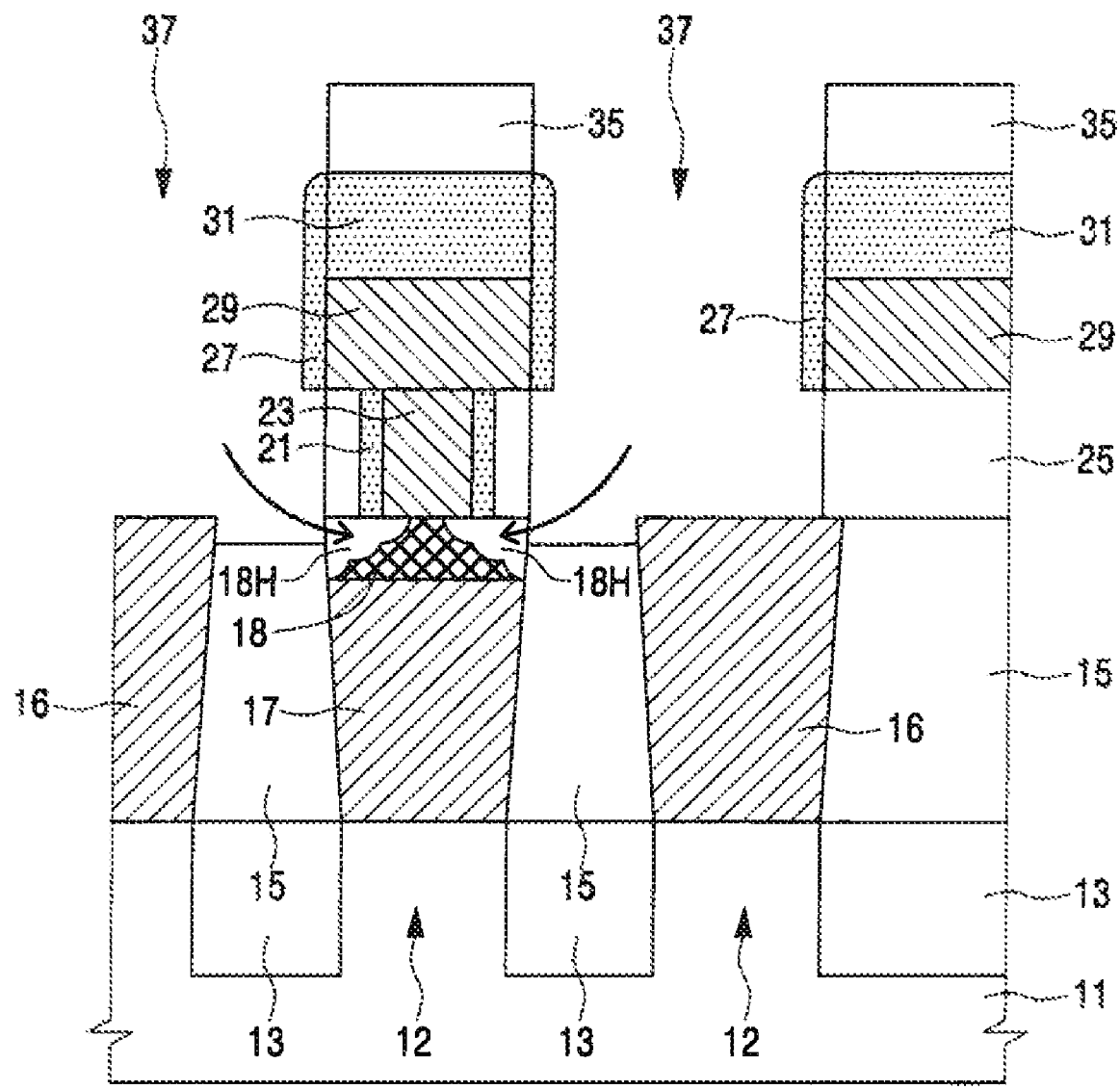
Figure 3:
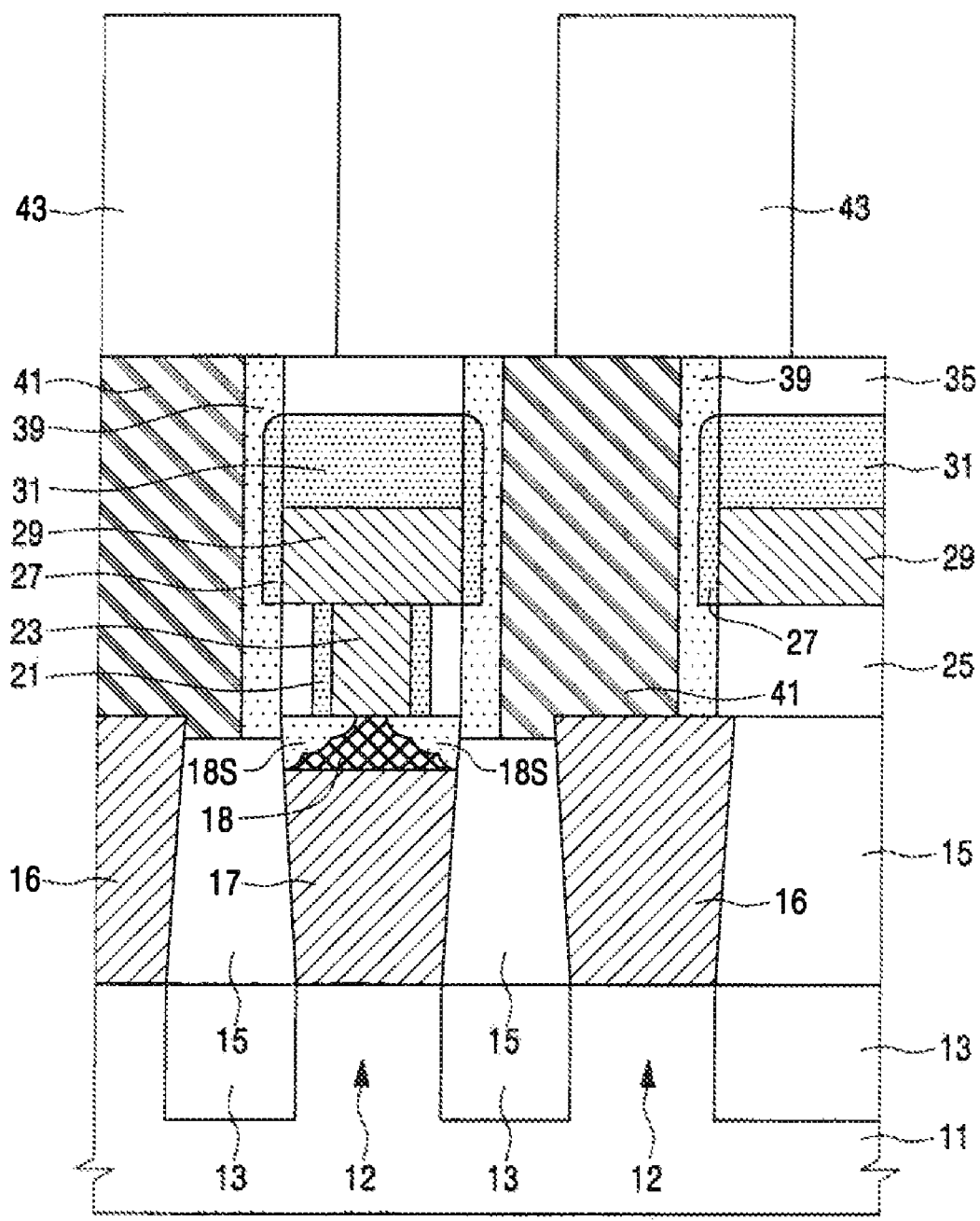

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity and are not necessarily to scale. In addition, when a layer is described to be formed "on" another layer or substrate, the layer may be formed directly on the other layer or substrate, or a third layer may be interposed between the layer and the other layer or substrate. Like numbers refer to like elements throughout the specification.

Figure 4:
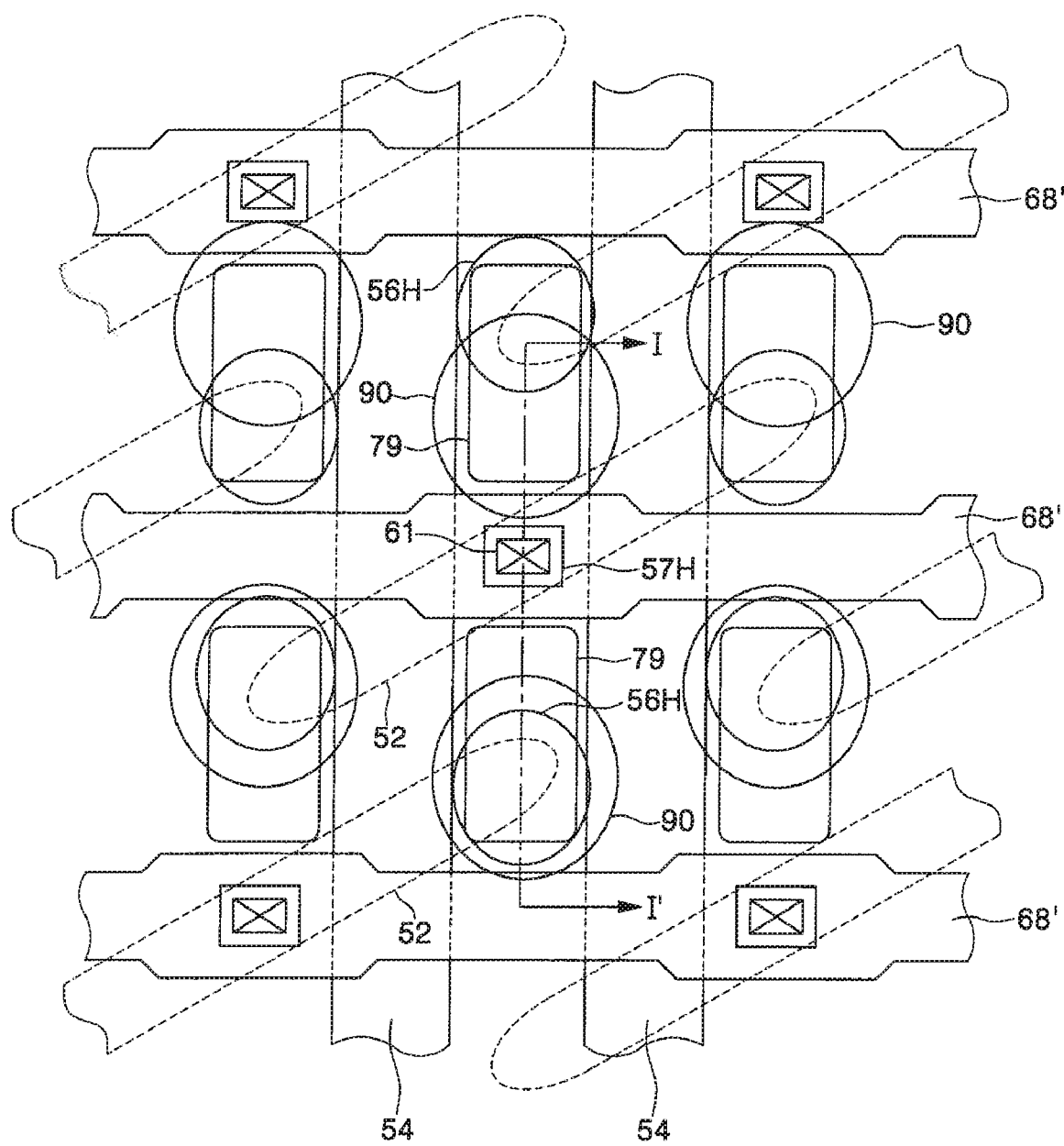
FIG. 4 is a plan view of a semiconductor device having a bit line pattern and a buried contact plug in accordance with an exemplary embodiment of the present invention.

FIG. 4 is a plan view of a semiconductor device having a bit line pattern and a buried contact plug in accordance with an exemplary embodiment of the present invention, and FIGS. 5 to 12 are cross-sectional views taken along line I-I' of FIG. 4 illustrating a method of fabricating a semiconductor device having an etch stop layer between a bit line pattern and a buried contact plug in accordance with an exemplary embodiment of the present invention.

A method of fabricating a semiconductor device having an etch stop layer between a bit line pattern and a buried contact plug according to exemplary embodiment of the present invention will now be described with reference to FIGS. 4 to 12.

Figure 5:
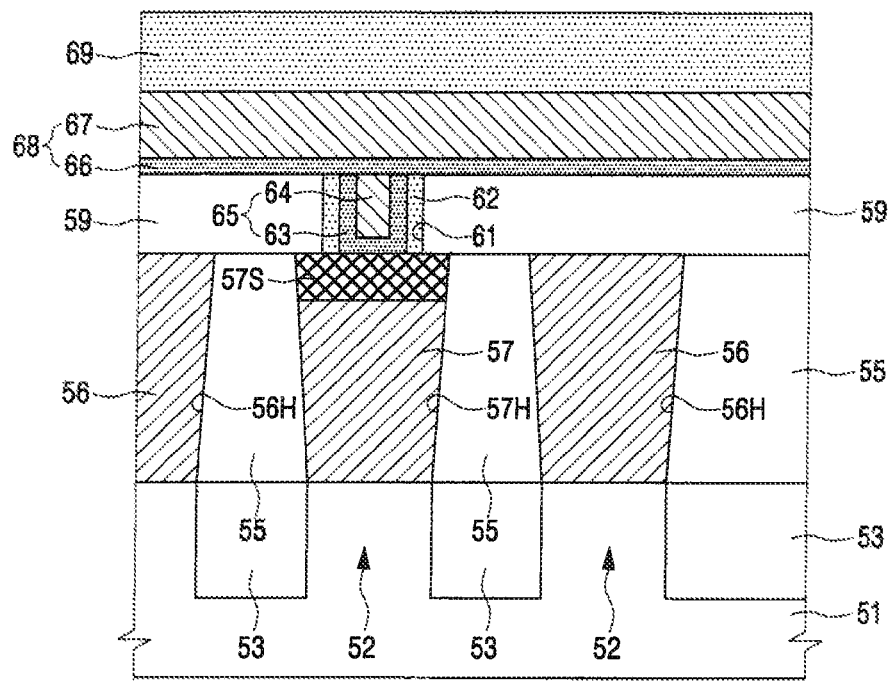
FIGS. 5 to 12 are cross-sectional views taken along line I-I' of FIG. 4 illustrating a method of fabricating a semiconductor device having an etch stop layer between a bit line pattern and a buried contact plug in accordance with an exemplary embodiment of the present invention.

Referring to FIGS. 4 and 5, an isolation layer 53 is formed within a substrate 51 to define an active region 52. The substrate 51 may be a semiconductor substrate such as a silicon wafer or silicon-on-insulator (SOI) wafer. The isolation layer 53 may include an insulating layer such as a high-density plasma (HDP) oxide layer. Structures such as a word line 54 crossing over the active region 52 may be formed, but they will be omitted for simplicity of description.

A lower interlayer dielectric layer 55 is formed on the surface of the substrate 51 having the isolation layer 53. The lower interlayer dielectric layer 55 may include a silicon oxide layer. The lower interlayer dielectric layer 55 is patterned to form first and second landing pad holes 56H and 57H, which partially expose the active region 52. The first landing pad hole 56H may act as a storage node landing pad hole, and the second landing pad hole 57H may act as a bit line landing pad hole.

A landing pad conductive layer is formed, which fills the first and second landing pad holes 56H and 57H and covers the surface of the substrate 51. The landing pad conductive layer may include a polysilicon layer. The landing pad conductive layer is planarized to form first and second landing pads 56 and 57, which penetrate the lower interlayer dielectric layer 55 and are in contact with the active region 52. The first landing pad 56 may act as a storage node landing pad, and the second landing pad 57 may act as a bit line landing pad. A chemical mechanical polishing (CMP) process employing the lower interlayer dielectric layer 55 as a stop layer may be applied to planarize the landing pad conductive layer. Alternatively, an etch-back process may be applied to planarize the landing pad conductive layer. Top surfaces of the landing pads 56 and 57 and the lower interlayer dielectric layer 55 may be formed to be at approximately the same level.

An intermediate interlayer dielectric layer 59 may be formed on the surface of the substrate 51 having the landing pads 56 and 57. The intermediate interlayer dielectric layer 59 may include an insulating layer such as a silicon oxide layer.

The intermediate interlayer dielectric layer 59 is patterned to form a bit contact hole 61, which partially exposes the second landing pad 57. The bit contact hole 61 may penetrate the intermediate interlayer dielectric layer 59 to partially expose the top surface of the second landing pad 57. While the bit contact hole 61 is formed, an upper region of the second landing pad 57 may be partially etched to be recessed downward.

A bit contact spacer 62 may be formed on a sidewall of the bit contact hole 61.

Specifically, an insulating layer may be formed, which covers the intermediate interlayer dielectric layer 59 and an inner wall of the bit contact hole 61. The insulating layer may be anisotropically etched until the second landing pad 57 is exposed at the bottom of the bit contact hole 61 so that the bit contact spacer 62 may be formed. The bit contact spacer 62 may include a material layer having an etch selectivity with respect to the intermediate interlayer dielectric layer 59 and the lower interlayer dielectric layer 55. For example, the bit contact spacer 62 may include a nitride layer such as a silicon nitride layer or silicon oxynitride layer.

A metal silicide layer 57S may be formed within the second landing pad 57 in a siliciding process. The siliciding process may include forming a metal layer on the second landing pad and annealing the metal layer.

Specifically, a metal layer and a capping layer may be sequentially deposited, which cover the intermediate interlayer dielectric layer 59 and an inner wall of the bit contact hole 61. The metal layer may include one selected from the group consisting of Ti, Ni, Co, W, Mo, Zr, Pt, Ir, Ta, and a mixture thereof. The capping layer may include TiN. Alternatively, the capping layer may be omitted. The substrate 51 having the metal layer is annealed to form the metal silicide layer 57S. The annealing may be separately carried out several times. If a portion of the metal layer and the capping layer remain after the reaction, they may be removed. As a result, the metal silicide layer 57S may include a layer containing one selected from the group consisting of Ti, Ni, Co, W, Mo, Zr, Pt, Ir, Ta, and a mixture thereof. For example, the metal silicide layer 57S may include one selected from the group consisting of TiSi, NiSi, CoSi, WSi, MoSi, ZrSi, PtSi, IrSi, and TaSi.

Alternatively, the metal silicide layer 57S may be formed before the bit contact spacer 62 is formed.

A bit contact plug 65 may be formed within the bit contact hole 61. The bit contact plug 65 may include a plug metal layer 64 and a plug barrier metal layer 63 surrounding sidewalls and a bottom surface of the plug metal layer 64. The plug metal layer 64 may include a tungsten (W) layer. The plug barrier metal layer 63 may include a layer containing one selected from the group consisting of Ti, TiN, Ta, and TaN.

A bit conductive layer 68 and a hard mask layer 69 may be sequentially deposited on the intermediate interlayer dielectric layer 59 having the bit contact plug 65. The bit conductive layer 68 may include a bit barrier metal layer 66 and a bit metal layer 67, which are sequentially stacked. The bit barrier metal layer 66 may include a layer containing one selected from the group consisting of Ti, TiN, Ta, and TaN. The bit metal layer 67 may include a tungsten layer. The hard mask layer 69 may include a material layer having an etch selectivity with respect to the bit conductive layer 68 and the intermediate interlayer dielectric layer 59. The hard mask layer 69 may include a nitride layer such as a silicon nitride layer or silicon oxynitride layer.

Alternatively, the bit conductive layer 68 may be formed before the bit contact plug 65 is formed. In this case, the bit barrier metal layer 66 and the bit metal layer 67, which are sequentially stacked, may be filled within the bit contact hole 61.

Figure 6:
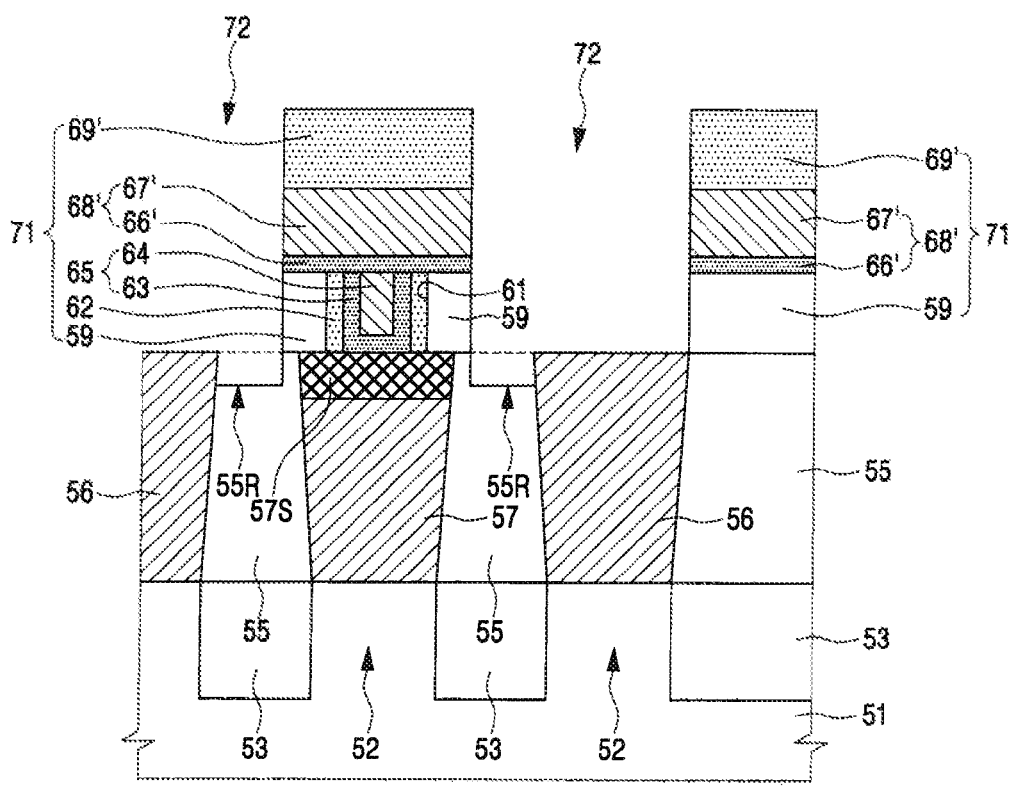

Referring to FIGS. 4 and 6, the hard mask layer 69 may be patterned to form a hard mask pattern 69' on the bit conductive layer 68. The hard mask pattern 69' may cover the bit contact plug 65. The bit conductive layer 68 may be etched using the hard mask pattern 69' as an etch mask to form bit lines 68'. The bit line 68' may include a bit barrier metal pattern 66' and a bit metal pattern 67', which are sequentially stacked. In addition, the bit line 68' may cover the bit contact plug 65. Subsequently, the intermediate interlayer dielectric layer 59 between the bit lines 68' may be removed using the hard mask pattern 69' and the bit lines 68' as etch masks. The process of removing the intermediate interlayer dielectric layer 59 may include an anisotropic etching process having an etch selectivity with respect to the hard mask pattern 69', the bit lines 68', and the first landing pad 56. As a result, the intermediate interlayer dielectric layer 59 may remain below the bit lines 68'.

The hard mask pattern 69', the bit line 68', the bit contact plug 65, the bit contact spacer 62, and the intermediate interlayer dielectric layer 59 may constitute a bit line pattern 71. A plurality of bit line patterns 71 may be parallel to each other on the substrate 51. In addition, gap regions 72 partially exposing the lower interlayer dielectric layer 55 and the first landing pad 56 may be formed between the bit line patterns 71.

As described above, the process of removing the intermediate interlayer dielectric layer 59 may be carried out using an etching condition having an etch selectivity with respect to the first landing pad 56. The process of removing the intermediate interlayer dielectric layer 59 may be carried out until the top surface of the first landing pad 56 is exposed. In addition, the process of removing the intermediate interlayer dielectric layer 59 may include a process of over-etching for a predetermined time after the top surface of the first landing pad 56 is exposed. In this case, the lower interlayer dielectric layer 55 between the first landing pad 56 and the second landing pad 57 may be etched so that a recessed region 55R may be formed. In this case, the depth of the recessed region 55R may be adjusted by the over-etching process. The recessed region 55R may be disposed lower than the metal silicide layer 57S.

The bit line patterns 71 may have larger widths than the second landing pads 57. In this case, the metal silicide layer 57S may be protected by the intermediate interlayer dielectric layer 59 and the lower interlayer dielectric layer 55. Alternatively, while the bit line patterns 71 are formed, the metal silicide layer 57S may be exposed within the gap regions 72. However, the process of removing the intermediate interlayer dielectric layer 59 is then carried out by the anisotropic etching process, so that the damage of the metal silicide layer 57S may be minimized.

Figure 7:
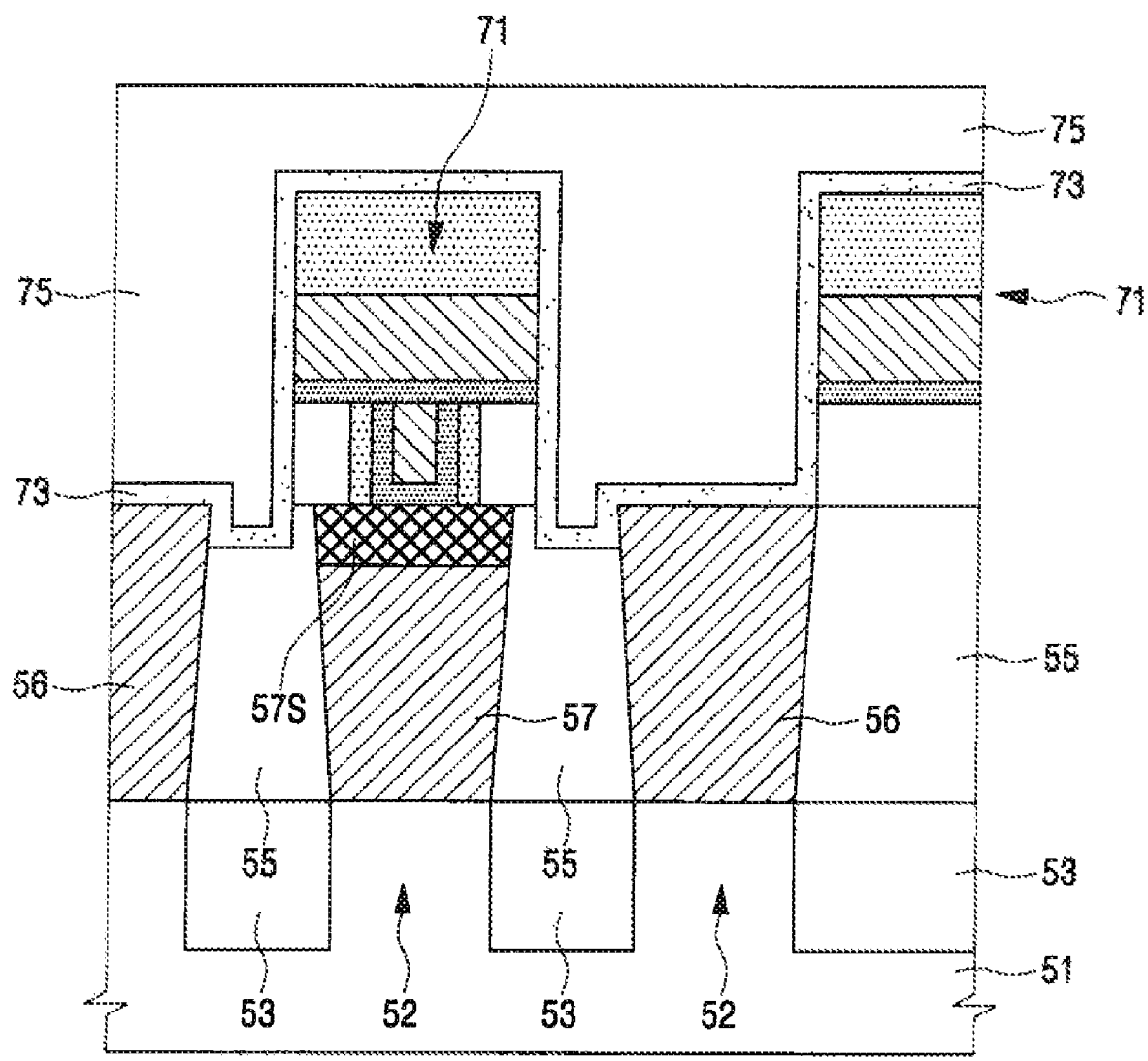

Referring to FIGS. 4 and 7, an etch stop layer 73 is formed on the surface of the substrate 51 having the bit line patterns 71. The etch stop layer 73 may include a nitride layer such as a silicon nitride layer or silicon oxynitride layer. The etch stop layer 73 may conformally cover inner walls of the gap regions 72. That is, the etch stop layer may cover the exposed first landing pad 56 and an inner wall of the recessed region 55R.

A bottom surface of the etch stop layer 73 may be lower than the top surface of the first landing pad 56 between the first landing pad 56 and the second landing pad 57. In addition, a bottom surface of the etch stop layer 73 may be lower than the metal silicide layer 57S between the first landing pad 56 and the second landing pad 57.

The etch stop layer 73 may further be about 0.2 times to about 1 times as thick as an interval spaced between the first and second landing pads 56 and 57. For example, the etch stop layer 73 may be about 0.5 times as thick as the interval spaced between the first and second landing pads 56 and 57.

An upper interlayer dielectric layer 75 may be formed on the substrate 51 having the etch stop layer 73. The upper interlayer dielectric layer 75 may include a material layer having an etch selectivity with respect to the etch stop layer 73. The upper interlayer dielectric layer 75 may include a silicon oxide layer.

The upper interlayer dielectric layer 75 may fill the gap regions 72 and cover the substrate 51. The upper interlayer dielectric layer 75 may be planarized to form a flat top surface. A CMP process or etch-back process may be applied to planarize the upper interlayer dielectric layer 75.

Figure 8:
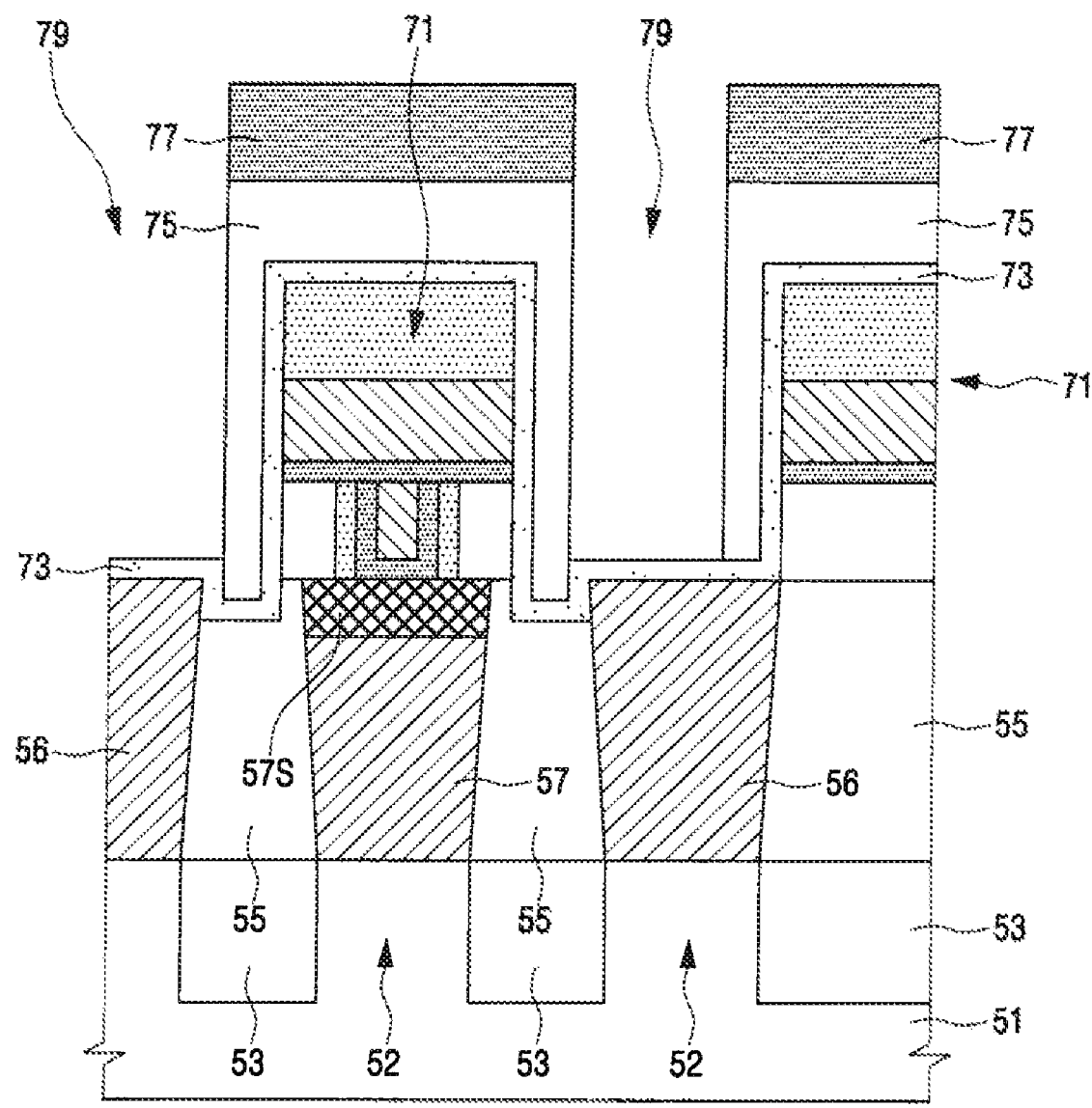

Referring to FIGS. 4 and 8, a buried contact mask 77 may be formed on the upper interlayer dielectric layer 75. The buried contact mask 77 may have openings which partially expose the upper interlayer dielectric layer 75 between the bit line patterns 71. The buried contact mask 77 may include a material layer or photoresist layer having an etch selectivity with respect to the upper interlayer dielectric layer 75.

The upper interlayer dielectric layer 75 may be partially removed using the buried contact mask 77 as an etch mask to form a preliminary contact hole 79 between the bit line patterns 71. Removing the upper interlayer dielectric layer 75 may be carried out using an etching process having an etch selectivity with respect to the etch stop layer 73. Removing the upper interlayer dielectric layer 75 may be carried out until the etch stop layer 73 is exposed at the bottom of the preliminary contact hole 79. In this case, the etch stop layer 73 at the bottom of the preliminary contact hole 79 may remain. That is, the first landing pad 56 may remain protected from the etching, which may prevent damage from being caused to the first landing pad 56.

The size of the opening may be controlled to adjust the size of the preliminary contact hole 79. For example, the size of the preliminary contact hole 79 may be adjusted to be smaller than the resolution limit of a photolithography process.

The buried contact mask 77 is then removed to expose the upper interlayer dielectric layer 75 having the preliminary contact hole 79.

Figure 9:
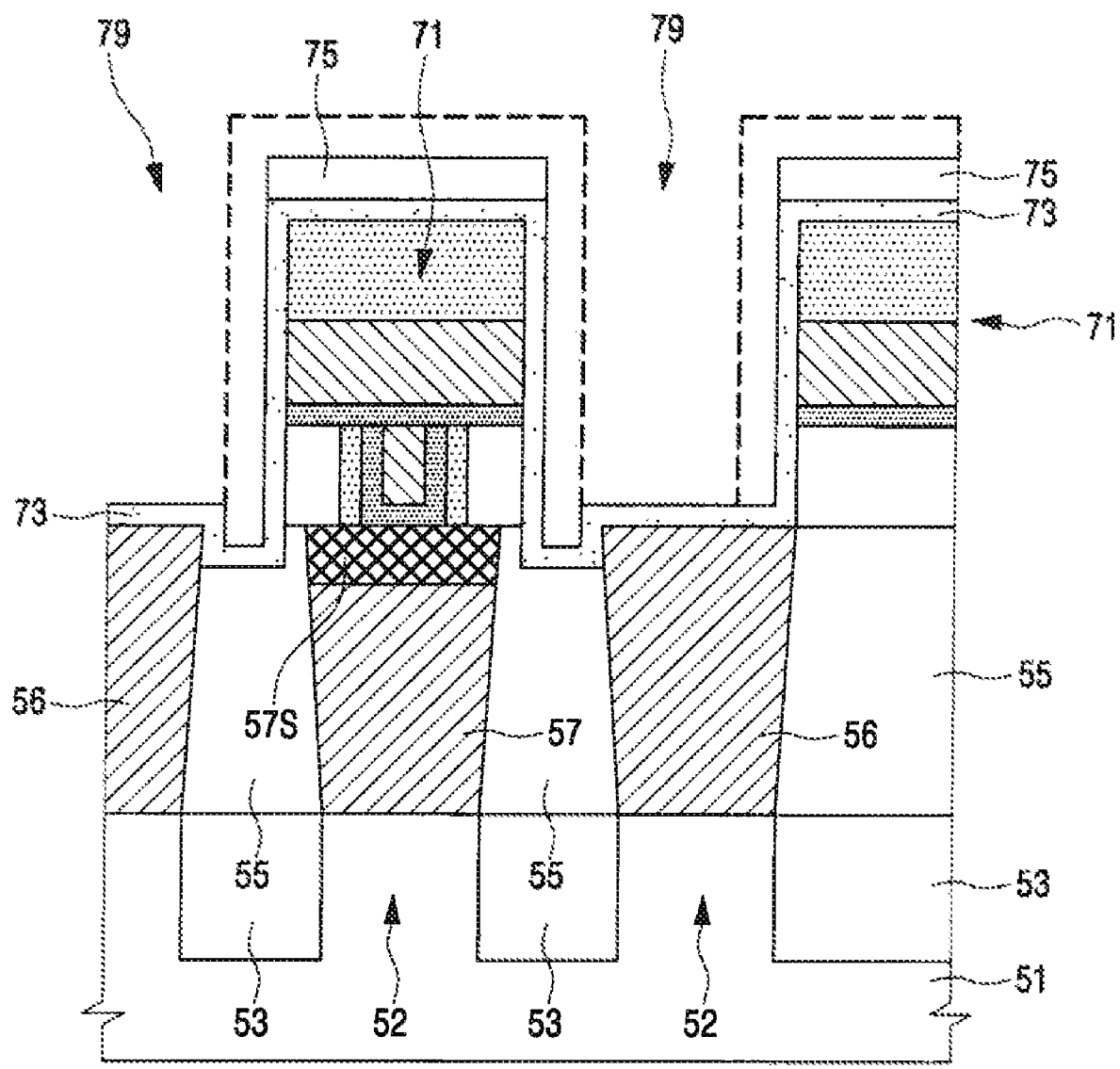

Referring to FIGS. 4 and 9, the upper interlayer dielectric layer 75 is isotropically etched to extend the preliminary contact hole 79. The isotropic etching of the upper interlayer dielectric layer 75 may be carried out using an etching process having an etch selectivity with respect to the etch stop layer 73. The isotropic etching of the upper interlayer dielectric layer 75 may be carried out until the etch stop layer 73 is exposed on the sidewall of the preliminary contact hole 79. In addition, the isotropic etching of the upper interlayer dielectric layer 75 may be carried out until the etch stop layer 73 is exposed on both sidewalls of the preliminary contact hole 79 facing each other.

The isotropic etching of the upper interlayer dielectric layer 75 may use an etching gas or a wet cleaning solution. For example, the wet cleaning solution may be an oxide etchant containing hydro fluoric acid or ammonium fluoride (NH$_4$F). While the isotropic etching of the upper interlayer dielectric layer 75 is carried out, the etch stop layer 73 acts to block the etching gas or the wet cleaning solution from contacting the metal silicide layer 57S. That is, the metal silicide layer 57S may be protected from etching damage by the etch stop layer 73.

Figure 10:
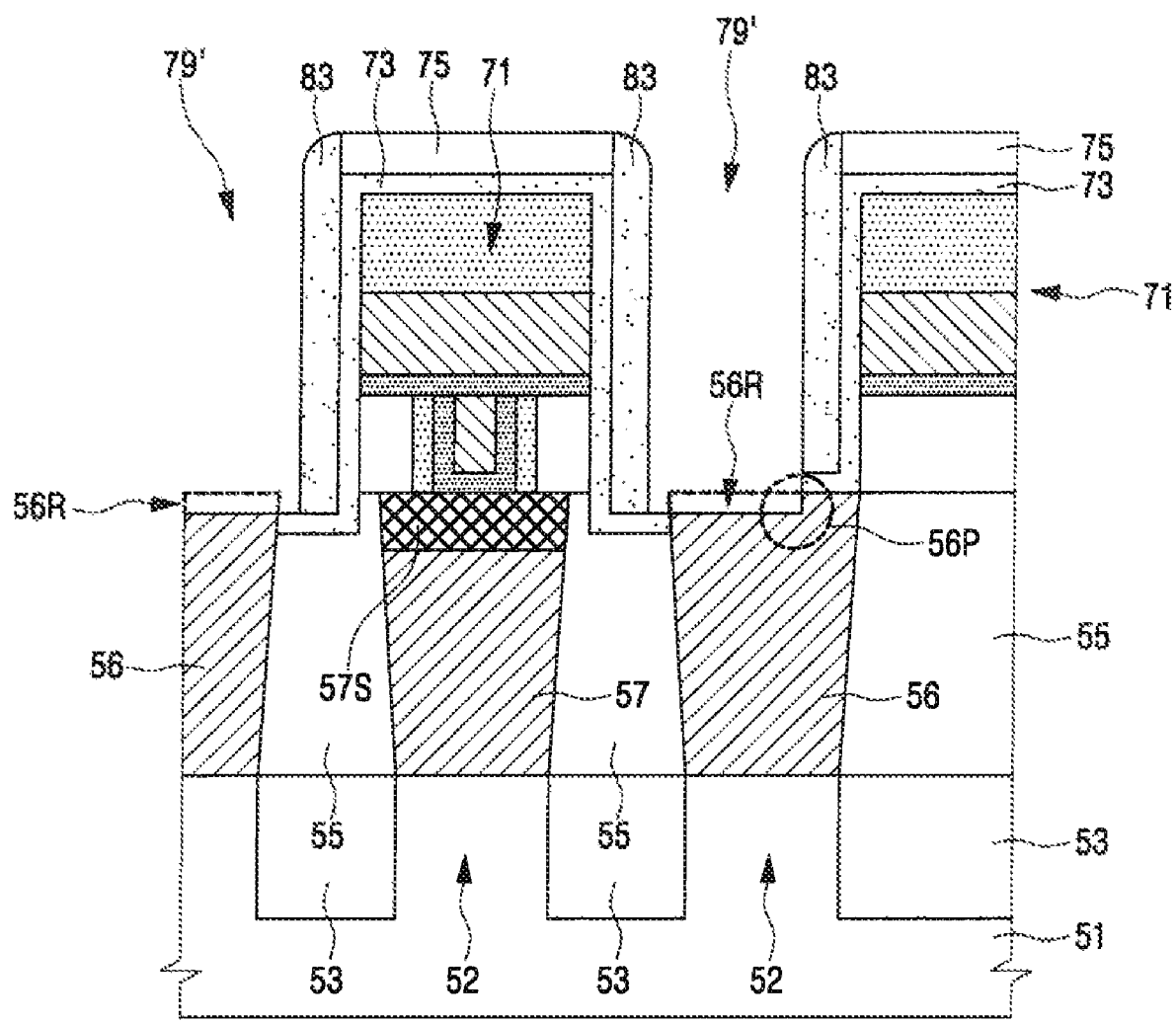

Referring to FIGS. 4 and 10, a spacer 83 may be formed on the sidewall of the extended preliminary contact hole 79. The spacer 83 may include one selected from the group consisting of a silicon nitride layer, a silicon oxynitride layer, a silicon oxide layer, a low-k dielectric layer, and a combination layer thereof.

Subsequently, the etch stop layer 73 disposed at the bottom of the extended preliminary contact hole 79 may be removed to form a buried contact hole 79'. Removing the etch stop layer 73 may be carried out by an anisotropic process. As a result, the first landing pad 56 may be exposed at the bottom of the buried contact hole 79'.

While the etch stop layer 73 is removed, the first landing pad 56 may also be etched so as to be recessed downward. That is, a pad recessed region 56R may be formed on the first landing pad 56. In this case, the top surface of the first landing pad 56 may have a 1 step recess profile 56P.

Figure 11:
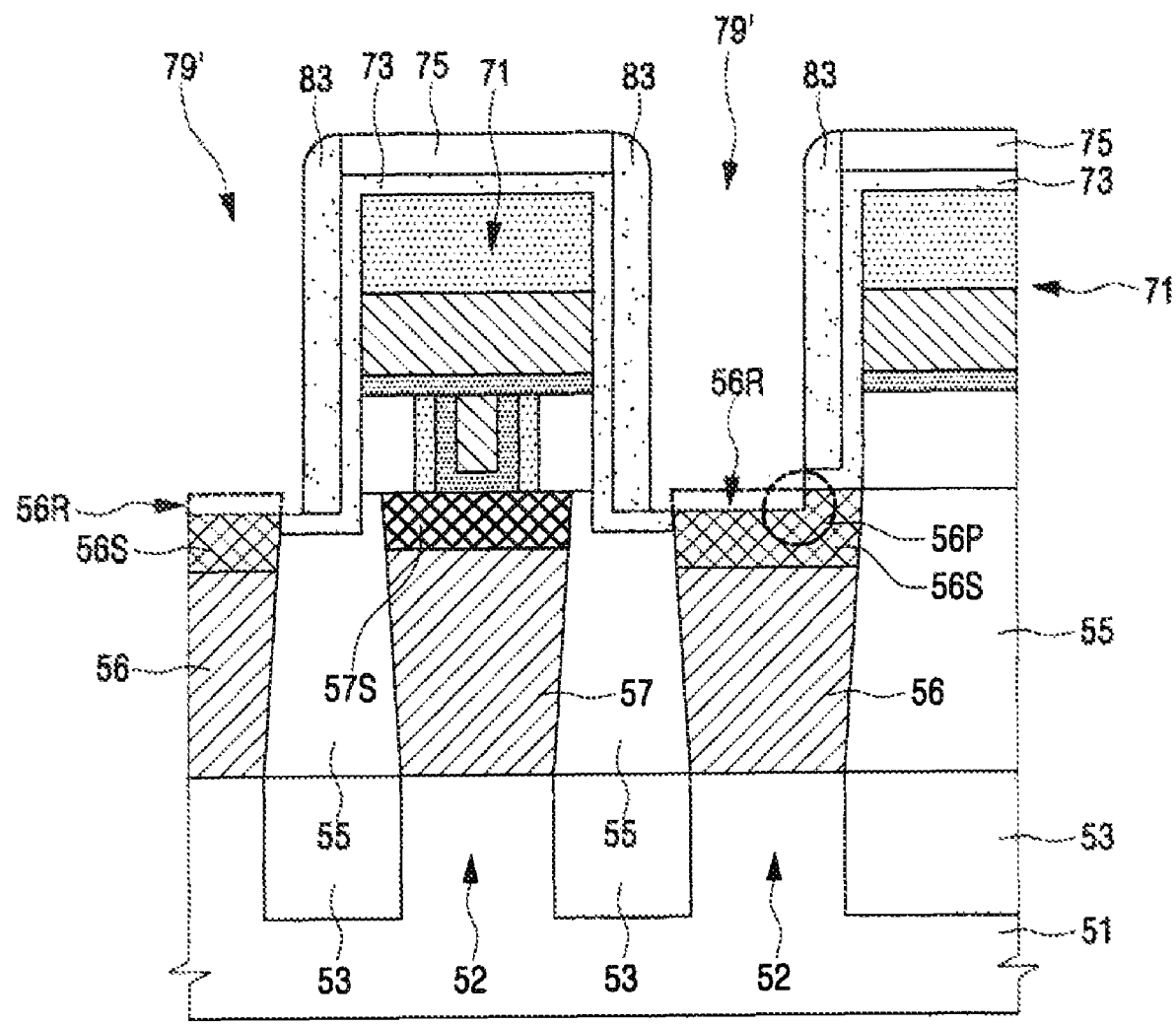

Referring to FIGS. 4 and 11, a buried contact metal silicide layer 56S may be formed in the exposed first landing pad 56.

Specifically, a metal layer and a capping layer may be sequentially stacked, which cover the exposed first landing pad 56. The metal layer may include one selected from the group consisting of Ti, Ni, Co, W, Mo, Zr, Pt, Ir, Ta, and a mixture thereof. The capping layer may include TiN. Alternatively, the capping layer may be omitted. The substrate 51 having the metal layer is annealed to form the buried contact metal silicide layer 56S. The annealing may be separately carried out several times. Subsequently, if a portion of the metal layer and the capping layer remain after the reaction, they may be removed. As a result, the buried contact metal silicide layer 56S may include a layer containing one selected from the group consisting of Ti, Ni, Co, W, Mo, Zr, Pt, Ir, Ta, and a mixture thereof. For example, the buried contact metal silicide layer 56S may include one selected from the group consisting of TiSi, NiSi, CoSi, WSi, MoSi, ZrSi, PtSi, IrSi, and TaSi.

Alternatively, the buried contact metal silicide layer 56S may be omitted.

Figure 12:
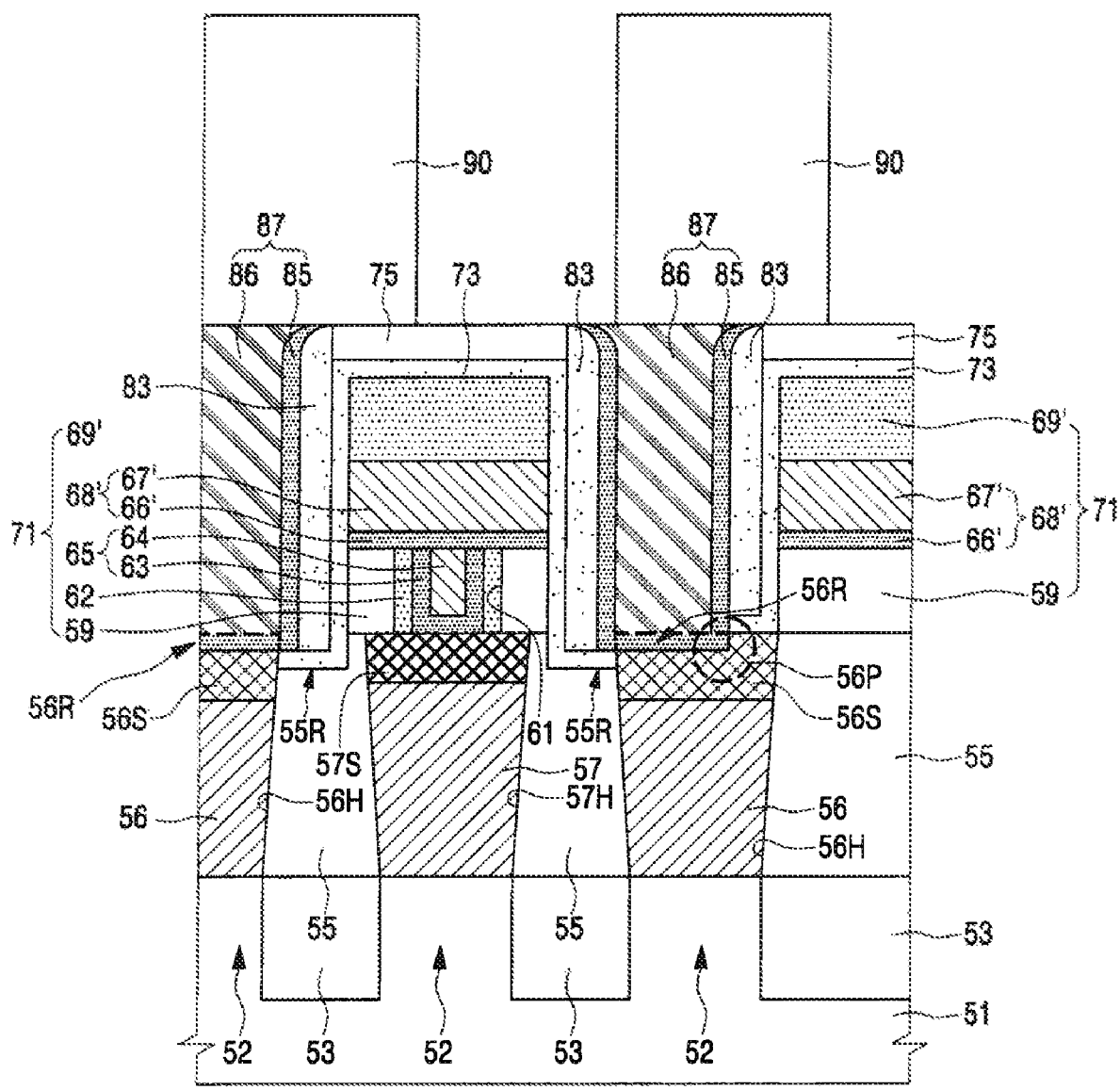

Referring to FIGS. 4 and 12, a buried contact plug 87 may be formed within the buried contact hole 79'. The buried contact plug 87 may include a polysilicon layer. In addition, the buried contact plug 87 may include a metal layer 86 and a barrier metal layer 85 surrounding the metal layer 86.

A storage node 90 may be formed on the buried contact plug 87. The storage node 90 may be electrically connected to the active region 52 via the buried contact plug 87 and the first landing pad 56.

As described above, the preliminary contact hole 79 may be extended, and the etch stop layer 73 disposed at the bottom of the extended preliminary contact hole 79 may be removed to form the buried contact hole 79'. While the preliminary contact hole 79 is being extended, the etch stop layer 73 acts to protect the metal silicide layer 57S from damage caused by the etching process. Accordingly, the buried contact hole 79' has a sufficient alignment margin with respect to the first landing pad 56. That is, a sufficient contact area between the buried contact plug 87 and the first landing pad 56 may be secured. Further, the buried contact plug 87 may be formed relatively large. In this case, the buried contact plug 87 may have a sufficient alignment margin with respect to the storage node 90.

In addition, the spacer 83 may be formed on a sidewall of the buried contact hole 79'. In this case, the spacer 83 and the etch stop layer 73 may act to insulate the buried contact plug 87 from the bit lines 68'.

In addition, the spacer 83 may include a low-k dielectric layer. In this case, the spacer 83 may act to minimize an electric interference between the buried contact plug 87 and the bit lines 68'.

The buried contact hole 79' may be a first contact hole of the semiconductor device, and the bit contact hole 61 may be a second contact hole. The bit line pattern 71 may be an interconnection pattern. The bit line 68' may be a conductive interconnection, where the bit line conductive layer 68 may be an interconnection conductive layer.

Hereinafter, a semiconductor device having an etch stop layer between a bit line pattern and a buried contact plug according to an exemplary embodiment of the present invention will be described with reference again to FIGS. 4 and 12.

Referring to FIGS. 4 and 12, an isolation layer 53 is formed within a substrate 51 to define an active region 52. The substrate 51 may be a semiconductor substrate such as a silicon wafer or SOI wafer. The isolation layer 53 may include an insulating layer such as an HDP oxide layer. Structures such as a word line 54 crossing over the active region 52 may be formed, but they will be omitted for simplicity of description.

The substrate 51 having the isolation layer 53 is covered by a lower interlayer dielectric layer 55. The lower interlayer dielectric layer 55 may be a silicon oxide layer. First and second landing pads 56 and 57 are disposed within the lower interlayer dielectric layer 55. The first and second landing pads 56 and 57 are in contact with the active region 52. The first and second landing pads 56 and 57 may be spaced apart from each other by the lower interlayer dielectric layer 55. The landing pads 56 and 57 may be conductive layers such as polysilicon layers.

The second landing pad 57 may have a metal silicide layer 57S. The metal silicide layer 57S may be disposed within an upper region of the second landing pad 57. The metal silicide layer 57S may have one selected from the group consisting of TiSi, NiSi, CoSi, WSi, MoSi, ZrSi, PtSi, IrSi, and TaSi.

A bit line pattern 71 covering the second landing pad 57 is disposed on the lower interlayer dielectric layer 55. A plurality of bit line patterns 71 may be parallel to each other on the substrate 51. The bit line patterns 71 may have larger widths than the second landing pads 57. In addition, gap regions 72 (shown in FIG. 6) partially exposing the lower interlayer dielectric layer 55 and the first landing pad 56 may be disposed between the bit line patterns 71.

The bit line pattern 71 may include a hard mask pattern 69', a bit line 68', a bit contact plug 65, a bit contact spacer 62, and an intermediate interlayer dielectric layer 59. The bit line 68' may cover the second landing pad 57. The bit line 68' may include a bit barrier metal pattern 66' and a bit metal pattern 67', which are sequentially stacked. The bit barrier metal layer 66 may have one selected from the group consisting of Ti, TiN, Ta, and TaN. The bit metal layer 67 may be a tungsten (W) layer. The hard mask pattern 69' may be disposed on the bit line 68'. The hard mask pattern 69' may be a material layer having an etch selectivity with respect to the bit line 68' and the intermediate interlayer dielectric layer 59. The hard mask pattern 69' may be a nitride layer such as a silicon nitride layer or silicon oxynitride layer. The intermediate interlayer dielectric layer 59 may be disposed between the bit line 68' and the lower interlayer dielectric layer 55. The intermediate interlayer dielectric layer 59 may be a silicon oxide layer. The bit contact plug 65, penetrating the intermediate interlayer dielectric layer 59, may be disposed between the bit line 68' and the second landing pad 57. That is, the bit line 68' may be electrically connected to the second landing pad 57 via the bit contact plug 65. The bit contact plug 65 may have a plug metal layer 64 and a plug barrier metal layer 63 surrounding a bottom surface and the sidewall of the plug metal layer 64. The plug metal layer 64 may be a tungsten (W) layer. The plug barrier metal layer 63 may include one selected from the group consisting of Ti, TiN, Ta, and TaN. The sidewall of the bit contact plug 65 may be surrounded by the bit contact spacer 62. The bit contact spacer 62 may include a material layer having an etch selectivity with respect to the intermediate interlayer dielectric layer 59 and the lower interlayer dielectric layer 55. For example, the bit contact spacer 62 may be a nitride layer such as a silicon nitride layer or silicon oxynitride layer.

The surface of the substrate 51 having the bit line patterns 71 is covered by an etch stop layer 73. The etch stop layer 73 may be a nitride layer such as a silicon nitride layer or silicon oxynitride layer. The etch stop layer 73 may conformally cover inner walls of the gap regions 72. That is, the etch stop layer 73 may cover the sidewalls of the bit line patterns 71, and may cover the lower interlayer dielectric layer 55 and the first landing pad 56 between the bit line patterns 71.

The bottom surface of the etch stop layer 73 may be lower than the top surface of the first landing pad 56 between the first landing pad 56 and the second landing pad 57. In addition, the bottom surface of the etch stop layer 73 may be lower than the metal silicide layer 57S between the first landing pad 56 and the second landing pad 57.

The etch stop layer 73 may be about 0.2 times to about 1 times as thick as an interval spaced between the first and second landing pads 56 and 57. For example, the etch stop layer 73 may be about 0.5 times as thick as the interval spaced between the first and second landing pads 56 and 57.

An upper interlayer dielectric layer 75 is disposed on the etch stop layer 73. The upper interlayer dielectric layer 75 may fill the gap regions 72 and may cover the substrate 51. The upper interlayer dielectric layer 75 may include a material layer having an etch selectivity with respect to the etch stop layer 73. For example, the upper interlayer dielectric layer 75 may include a silicon oxide layer.

A buried contact plug 87 is disposed between the bit line patterns 71. The buried contact plug 87 penetrates the upper interlayer dielectric layer 75 and the etch stop layer 73 to be in contact with the first landing pad 56. The top surface of the first landing pad 56 may have a 1 step recess profile 56P. The buried contact plug 87 may include a polysilicon layer. In addition, the buried contact plug 87 may include a metal layer 86 and a barrier metal layer 85 surrounding the metal layer 86. The first landing pad 56 may include a buried contact metal silicide layer 56S. The buried contact metal silicide layer 56S may be disposed in an upper region of the first landing pad 56. The buried contact metal silicide layer 56S may include one selected from the group consisting of TiSi, NiSi, CoSi, WSi, MoSi, ZrSi, PtSi, IrSi, and TaSi. Alternatively, the buried contact metal silicide layer 56S may be omitted.

A spacer 83 may be disposed to surround a sidewall of the buried contact plug 87. An outer wall of the spacer 83 may be in contact with the etch stop layer 73 between the buried contact plug 87 and the bit line patterns 71. The spacer 83 may include one selected from the group consisting of a silicon nitride layer, a silicon oxynitride layer, a silicon oxide layer, a low-k dielectric layer, and a combination layer thereof.

A storage node 90 may be disposed on the buried contact plug 87. The storage node 90 may be electrically connected to the active region 52 via the buried contact plug 87 and the first landing pad 56.

The bit line pattern 71 may be an interconnection pattern. The bit line 68' may be a conductive interconnection.

According to the present invention as described above, after bit line patterns are formed, an etch stop layer is formed to cover the surface of a substrate having the bit line patterns. A preliminary contact hole penetrating an upper interlayer dielectric layer may be formed between the bit line patterns. The preliminary contact hole may be extended. The etch stop layer at the bottom of the extended preliminary contact hole may be removed to form a buried contact hole exposing a first landing pad. A spacer may be formed on a sidewall of the buried contact hole. A buried contact plug may be formed within the buried contact hole.

While the preliminary contact hole is extended, the etch stop layer acts to prevent the conductive pattern below the bit line patterns from being damaged. That is, the etch stop layer acts to prevent a metal silicide layer within a second landing pad from being damaged due to the etching. Accordingly, the buried contact hole has a sufficient alignment margin with respect to the first landing pad. That is, a sufficient contact area between the buried contact plug and the first landing pad may be secured. Further, the buried contact plug may be formed relatively large.

In addition, the spacer may include a low-k dielectric layer. In this case, the spacer may act to minimize electrical interference between the buried contact plug and the bit lines.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
    a lower interlayer dielectric layer disposed on a substrate;
    a first landing pad formed in the interlayer dielectric layer to contact the substrate;
    a second landing pad formed in the interlayer dielectric layer to contact the substrate, where the second landing pad includes a metal silicide layer and is spaced apart from the first landing pad;
    an interconnection pattern disposed on the lower interlayer dielectric layer to cover the second landing pad, the interconnection pattern including an intermediate dielectric layer, wherein the lower interlayer dielectric layer and the intermediate dielectric layer partially surround the metal silicide layer;
    an etch stop layer formed to cover sidewalls of the interconnection pattern and to cover a portion of the lower interlayer dielectric;
    an upper interlayer dielectric layer disposed on the etch stop layer to fill a gap region adjacent to the interconnection pattern; and
    a buried contact plug formed in the upper interlayer dielectric layer and etch stop layer to contact the first landing pad in the gap region.

2. The semiconductor device according to claim 1, wherein the first landing pad has a top surface with a 1 step recess profile.

3. The semiconductor device according to claim 1, wherein the etch stop layer has a bottom surface lower than a top surface of the first landing pad between the first and second landing pads.

4. The semiconductor device according to claim 3, wherein the bottom surface of the etch stop layer is lower than the metal silicide layer of the second landing pad.

5. The semiconductor device according to claim 1, further comprising:
    a spacer surrounding sidewalls of the buried contact plug, wherein an outer wall of the spacer is in contact with the etch stop layer between the buried contact plug and the interconnection pattern.

6. The semiconductor device according to claim 5, wherein the spacer includes one selected from the group consisting of a silicon nitride layer, a silicon oxynitride layer, a silicon oxide layer, a low-k dielectric layer, and a combination layer thereof.

7. The semiconductor device according to claim 1, wherein the interconnection pattern comprises:
    an intermediate interlayer dielectric layer disposed on the lower interlayer dielectric layer;
    a conductive pattern disposed on the intermediate interlayer dielectric layer; and
    a bit contact plug disposed between the conductive interconnection and the second landing pad and penetrating the intermediate interlayer dielectric layer.

8. The semiconductor device according to claim 1, wherein the metal silicide layer includes one selected from the group consisting of TiSi, NiSi, CoSi, WSi, MoSi, ZrSi, PtSi, IrSi, and TaSi.

* * * * *